United States Patent
Noh et al.

(10) Patent No.: US 10,148,290 B2
(45) Date of Patent: Dec. 4, 2018

(54) METHOD AND APPARATUS FOR ENCODING OR DECODING CHANNEL CODE IN A WIRELESS COMMUNICATION SYSTEM

(71) Applicant: LG ELECTRONICS INC., Seoul (KR)

(72) Inventors: Kwangseok Noh, Seoul (KR); Hyunsoo Ko, Seoul (KR); Dongkyu Kim, Seoul (KR); Sangrim Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 38 days.

(21) Appl. No.: 15/091,507

(22) Filed: Apr. 5, 2016

(65) Prior Publication Data

US 2016/0294512 A1    Oct. 6, 2016

Related U.S. Application Data

(60) Provisional application No. 62/143,786, filed on Apr. 6, 2015.

(51) Int. Cl.
| | |
|---|---|
| *H03M 13/35* | (2006.01) |
| *H04L 1/00* | (2006.01) |
| *H03M 13/37* | (2006.01) |
| *H04L 1/16* | (2006.01) |

(52) U.S. Cl.
CPC ....... *H03M 13/35* (2013.01); *H03M 13/3761* (2013.01); *H04L 1/0045* (2013.01); *H04L 1/0061* (2013.01); *H04L 1/1607* (2013.01)

(58) Field of Classification Search
None
See application file for complete search history.

(56) References Cited

U.S. PATENT DOCUMENTS

| | | | | |
|---|---|---|---|---|
| 6,182,264 | B1* | 1/2001 | Ott | H03M 13/09 |
| | | | | 714/774 |
| 8,949,690 | B2* | 2/2015 | Sugahara | G06F 11/1048 |
| | | | | 714/764 |
| 9,680,509 | B2* | 6/2017 | Kwok | H03M 13/617 |
| 2002/0003812 | A1* | 1/2002 | Haartsen | H04L 1/0061 |
| | | | | 370/474 |
| 2002/0120901 | A1* | 8/2002 | Poirier | H03M 13/09 |
| | | | | 714/752 |
| 2009/0313516 | A1* | 12/2009 | Shin | H04L 1/0003 |
| | | | | 714/748 |
| 2010/0281341 | A1* | 11/2010 | Wu | H03M 13/2909 |
| | | | | 714/763 |

(Continued)

*Primary Examiner* — Steve N Nguyen
(74) *Attorney, Agent, or Firm* — Lee Hong Degerman Kang & Waimey (57) ABSTRACT

A method for decoding a channel code by a communication apparatus in a wireless communication system is disclosed. The method includes determining whether a cyclic redundancy check (CRC) of a block including a codeword having a first quality of service (QoS) has been decoded successfully by decoding the codeword having the first QoS, and if the CRC of the block has been decoded successfully, decoding a first codeword corresponding to the codeword having the first QoS, and determining whether a transport block (TB) CRC has been decoded successfully by checking the TB CRC.

12 Claims, 8 Drawing Sheets

(56) References Cited

U.S. PATENT DOCUMENTS

| | | | |
|---|---|---|---|
| 2012/0014242 A1* | 1/2012 | Kim | H04B 7/0413 370/203 |
| 2014/0376358 A1* | 12/2014 | Eder | H04L 1/1845 370/216 |
| 2014/0380119 A1* | 12/2014 | Sugahara | G06F 11/1048 714/763 |

* cited by examiner

METHOD AND APPARATUS FOR ENCODING OR DECODING CHANNEL CODE IN A WIRELESS COMMUNICATION SYSTEM

CROSS-REFERENCE TO RELATED APPLICATION

Pursuant to 35 U.S.C. § 119(e), this application claims the benefit of U.S. Provisional Application No. 62/143,786, filed on Apr. 6, 2015, the contents of which are hereby incorporated by reference herein in its entirety.

BACKGROUND OF THE INVENTION

Field of the Invention

The present invention relates to wireless communication, and more particularly, to a method and apparatus for encoding or decoding a channel code in a wireless communication system.

Discussion of the Related Art

It is essential to use a channel code in a broadcasting system as well as a communication system such as $3^{rd}$ generation partnership project (3GPP) long term evolution (LTE). In a general method for configuring a channel code, a transmitter encodes an input symbol through an encoder and transmits the code symbol, and a receiver recovers the input symbol by decoding using the code symbol.

The size of an input symbol and the size of a code symbol vary depending on systems. For a Turbo code used for data information in 3GPP LTE, the size of an input symbol is up to 6144 bits, and the size of a code symbol is up to 18432 (=6144×3) bits.

However, a decoding procedure for a Turbo code in a legacy LTE system is based on the premise that all of received codewords are decoded. As a result, decoding overhead is increased and fast ACKnowledgement/Negative ACKnowledgement (ACK/NACK) transmission is difficult.

SUMMARY OF THE INVENTION

Accordingly, the present invention is directed to a method and apparatus for encoding or decoding a channel code in a wireless communication system that substantially obviate one or more problems due to limitations and disadvantages of the related art.

An object of the present invention is to provide a method for decoding a channel code by a communication apparatus in a wireless communication system.

Another object of the present invention is to provide a communication apparatus for decoding a channel code in a wireless communication system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for decoding a channel code by a communication apparatus in a wireless communication system includes determining whether a cyclic redundancy check (CRC) of a block including a codeword having a first quality of service (QoS) has been decoded successfully by decoding the codeword having the first QoS, and if the CRC of the block has been decoded successfully, decoding a first codeword corresponding to the codeword having the first QoS, and determining whether a transport block (TB) CRC has been decoded successfully by checking the TB CRC. The method may further include, if the TB CRC has been decoded successfully, generating an acknowledgement (ACK) signal.

The method may further include, if the CRC of the block has not been decoded successfully or the TB CRC has not been decoded successfully, determining whether the CRC of the block including a codeword having a second QoS has been decoded successfully by decoding the codeword having the second QoS, and if the CRC of the block has been decoded successfully, decoding a second codeword corresponding to the codeword having the second QoS, and determining whether the TB CRC has been decoded successfully by checking the TB CRC. The method may further include, if the TB CRC has been decoded successfully, generating an ACK signal. The block may include the codeword having the first QoS, the codeword having the second QoS, and the CRC of the block, and the method may further include, if it is determined that the TB CRC has not been decoded successfully by decoding the second codeword, generating a negative ACK (NACK) signal. The length of second codeword may be longer than that of the first codeword.

The QoS may include a target packet error rate (PER). A target PER of the codeword having the first QoS may be set to be equal to or lower than a target PER of the first codeword.

In another aspect of the present invention, a communication apparatus for decoding a channel code in a wireless communication system includes a processor configured to determine whether a CRC of a block including a codeword having a first QoS has been decoded successfully by decoding the codeword having the first QoS, and if the CRC of the block has been decoded successfully, decode a first codeword corresponding to the codeword having the first QoS, and determine whether a TB CRC has been decoded successfully by checking the TB CRC.

If the CRC of the block has not been decoded successfully or the TB CRC has not been decoded successfully, the processor may be configured to determine whether the CRC of the block including a codeword having a second QoS has been decoded successfully by decoding the codeword having the second QoS, and if the CRC of the block has been decoded successfully, decode a second codeword corresponding to the codeword having the second QoS, and determine whether the TB CRC has been decoded successfully by checking the TB CRC. The block may include the codeword having the first QoS, the codeword having the second QoS, and the CRC of the block, and if the processor determines that the TB CRC has not been decoded successfully by decoding the second codeword, the processor may be configured to generate a NACK signal. The QoS may include a target PER. A target PER of the codeword having the first QoS may be set to be equal to or lower than a target PER of the first codeword. The length of second codeword may be longer than that of the first codeword.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. In the following detailed description of the invention includes details to help the full understanding of the present invention. Yet, it is apparent to those skilled in the art that the present invention can be implemented without these details. For instance, although the following descriptions are made in detail on the assumption that a mobile communication system includes 3GPP LTE system, the following descriptions are applicable to other random mobile communication systems in a manner of excluding unique features of the 3GPP LTE.

Occasionally, to prevent the present invention from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like. Although the present specification is described based on 3GPP LTE system or 3GPP LTE-A system, contents of the present invention may be applicable to various kinds of other communication systems.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

The following descriptions are usable for various wireless access systems including code division multiple access (CDMA), frequency division multiple access (FDMA), time division multiple access (TDMA), orthogonal frequency division multiple access (OFDMA), single carrier frequency division multiple access (SC-FDMA) and the like. CDMA can be implemented by such a radio technology as universal terrestrial radio access (UTRA), CDMA 2000 and the like. TDMA can be implemented with such a radio technology as global system for mobile communications/general packet radio service/enhanced data rates for GSM evolution (GSM/GPRS/EDGE). OFDMA can be implemented with such a radio technology as IEEE 802.11 (Wi-Fi), IEEE 802.16 (WiMAX), IEEE 802.20, E-UTRA (Evolved UTRA), etc. UTRA is a part of universal mobile telecommunications system (UMTS). 3rd generation partnership project (3GPP) long term evolution (LTE) is a part of evolved UMTS (E-UMTS) that uses E-UTRA. The 3GPP LTE employs OFDMA in DL and SC-FDMA in UL. And, LTE-A (LTE-Advanced) is an evolved version of 3GPP LTE.

Moreover, in the following description, specific terminologies are provided to help the understanding of the present invention. And, the use of the specific terminology can be modified into another form within the scope of the technical idea of the present invention.

Figure 1:
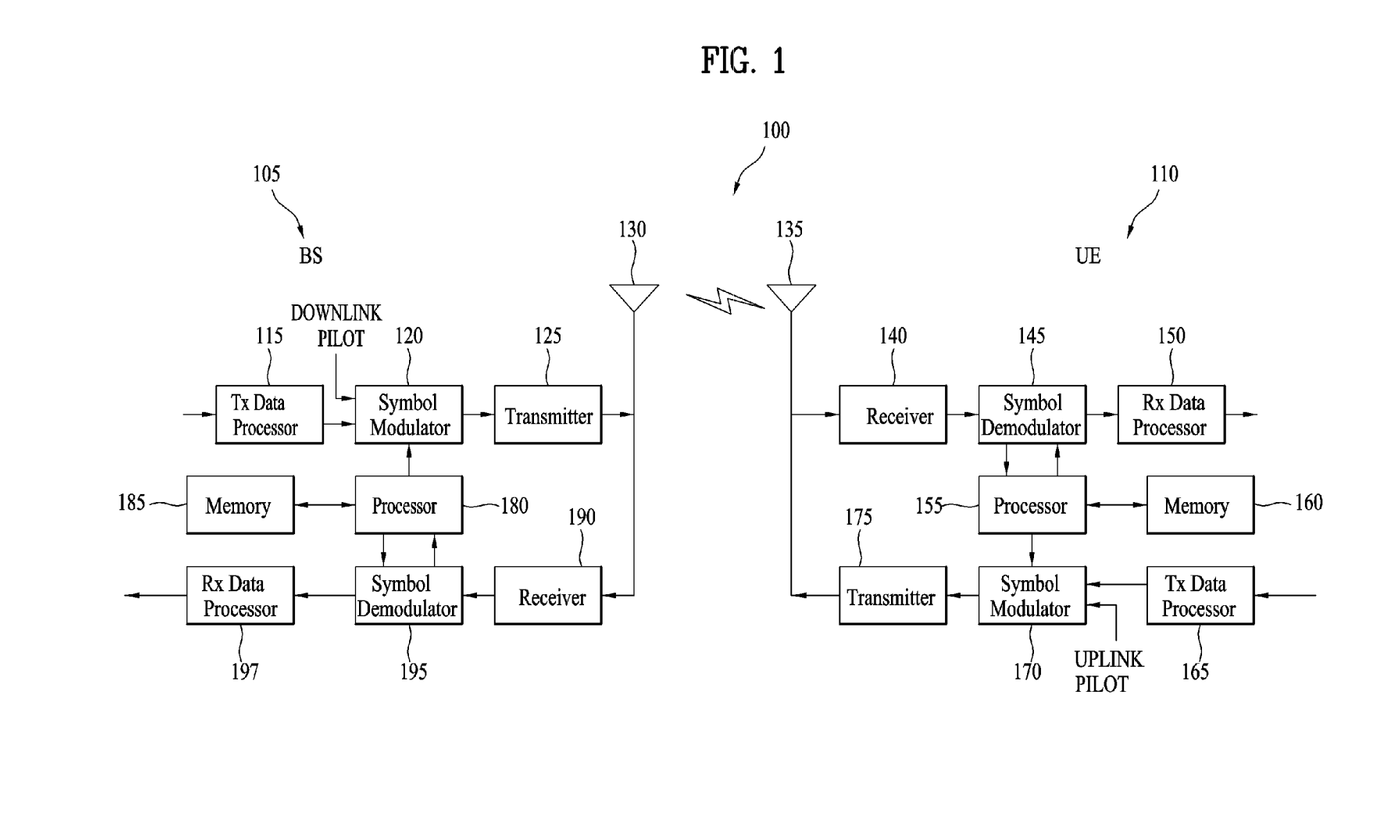
FIG. 1 is a block diagram illustrating structures of a Base Station (BS) 105 and a User Equipment (UE) 110 in a wireless communication system.

FIG. 1 is a block diagram for configurations of a base station 105 and a user equipment 110 in a wireless communication system 100.

Although one base station 105 and one user equipment 110 (D2D user equipment included) are shown in the drawing to schematically represent a wireless communication system 100, the wireless communication system 100 may include at least one base station and/or at least one user equipment.

Referring to FIG. 1, a base station 105 may include a transmitted (Tx) data processor 115, a symbol modulator 120, a transmitter 125, a transceiving antenna 130, a processor 180, a memory 185, a receiver 190, a symbol demodulator 195 and a received data processor 197. And, a user equipment 110 may include a transmitted (Tx) data processor 165, a symbol modulator 170, a transmitter 175, a transceiving antenna 135, a processor 155, a memory 160, a receiver 140, a symbol demodulator 155 and a received data processor 150. Although the base station/user equipment 105/110 includes one antenna 130/135 in the drawing, each of the base station 105 and the user equipment 110 includes a plurality of antennas. Therefore, each of the base station 105 and the user equipment 110 of the present invention supports an MIMO (multiple input multiple output) system. And, the base station 105 according to the present invention may support both SU-MIMO (single user-MIMO) and MU-MIMO (multi user-MIMO) systems.

In downlink, the transmitted data processor 115 receives traffic data, codes the received traffic data by formatting the received traffic data, interleaves the coded traffic data, modulates (or symbol maps) the interleaved data, and then provides modulated symbols (data symbols). The symbol modulator 120 provides a stream of symbols by receiving and processing the data symbols and pilot symbols.

The symbol modulator 120 multiplexes the data and pilot symbols together and then transmits the multiplexed symbols to the transmitter 125. In doing so, each of the transmitted symbols may include the data symbol, the pilot symbol or a signal value of zero. In each symbol duration, pilot symbols may be contiguously transmitted. In doing so, the pilot symbols may include symbols of frequency division multiplexing (FDM), orthogonal frequency division multiplexing (OFDM), or code division multiplexing (CDM).

The transmitter 125 receives the stream of the symbols, converts the received stream to at least one or more analog signals, additionally adjusts the analog signals (e.g., amplification, filtering, frequency upconverting), and then generates a downlink signal suitable for a transmission on a radio channel. Subsequently, the downlink signal is transmitted to the user equipment via the antenna 130.

In the configuration of the user equipment 110, the receiving antenna 135 receives the downlink signal from the base station and then provides the received signal to the receiver 140. The receiver 140 adjusts the received signal (e.g., filtering, amplification and frequency downconverting), digitizes the adjusted signal, and then obtains samples. The symbol demodulator 145 demodulates the received pilot symbols and then provides them to the processor 155 for channel estimation.

The symbol demodulator 145 receives a frequency response estimated value for downlink from the processor 155, performs data demodulation on the received data symbols, obtains data symbol estimated values (i.e., estimated values of the transmitted data symbols), and then provides the data symbols estimated values to the received (Rx) data processor 150. The received data processor 150 reconstructs the transmitted traffic data by performing demodulation (i.e., symbol demapping, deinterleaving and decoding) on the data symbol estimated values.

The processing by the symbol demodulator 145 and the processing by the received data processor 150 are complementary to the processing by the symbol modulator 120 and the processing by the transmitted data processor 115 in the base station 105, respectively.

In the user equipment 110 in uplink, the transmitted data processor 165 processes the traffic data and then provides data symbols. The symbol modulator 170 receives the data symbols, multiplexes the received data symbols, performs modulation on the multiplexed symbols, and then provides a stream of the symbols to the transmitter 175. The transmitter 175 receives the stream of the symbols, processes the received stream, and generates an uplink signal. This uplink signal is then transmitted to the base station 105 via the antenna 135.

In the base station 105, the uplink signal is received from the user equipment 110 via the antenna 130. The receiver 190 processes the received uplink signal and then obtains samples. Subsequently, the symbol demodulator 195 processes the samples and then provides pilot symbols received in uplink and a data symbol estimated value. The received data processor 197 processes the data symbol estimated value and then reconstructs the traffic data transmitted from the user equipment 110.

The processor 155/180 of the user equipment/base station 110/105 directs operations (e.g., control, adjustment, management, etc.) of the user equipment/base station 110/105. The processor 155/180 may be connected to the memory unit 160/185 configured to store program codes and data. The memory 160/185 is connected to the processor 155/180 to store operating systems, applications and general files.

The processor 155/180 may be called one of a controller, a microcontroller, a microprocessor, a microcomputer and the like. And, the processor 155/180 may be implemented using hardware, firmware, software and/or any combinations thereof. In the implementation by hardware, the processor 155/180 may be provided with such a device configured to implement the present invention as ASICs (application specific integrated circuits), DSPs (digital signal processors), DSPDs (digital signal processing devices), PLDs (programmable logic devices), FPGAs (field programmable gate arrays), and the like.

Meanwhile, in case of implementing the embodiments of the present invention using firmware or software, the firmware or software may be configured to include modules, procedures, and/or functions for performing the above-explained functions or operations of the present invention. And, the firmware or software configured to implement the present invention is loaded in the processor 155/180 or saved in the memory 160/185 to be driven by the processor 155/180.

Layers of a radio protocol between a user equipment/base station and a wireless communication system (network) may be classified into 1st layer L1, 2nd layer L2 and 3rd layer L3 based on 3 lower layers of OSI (open system interconnection) model well known to communication systems. A physical layer belongs to the 1st layer and provides an information transfer service via a physical channel. RRC (radio resource control) layer belongs to the 3rd layer and provides control radio resourced between UE and network. A user equipment and a base station may be able to exchange RRC messages with each other through a wireless communication network and RRC layers.

In the present specification, although the processor 155/180 of the user equipment/base station performs an operation of processing signals and data except a function for the user equipment/base station 110/105 to receive or transmit a signal, for clarity, the processors 155 and 180 will not be mentioned in the following description specifically. In the following description, the processor 155/180 can be regarded as performing a series of operations such as a data processing and the like except a function of receiving or transmitting a signal without being specially mentioned.

Figure 2:
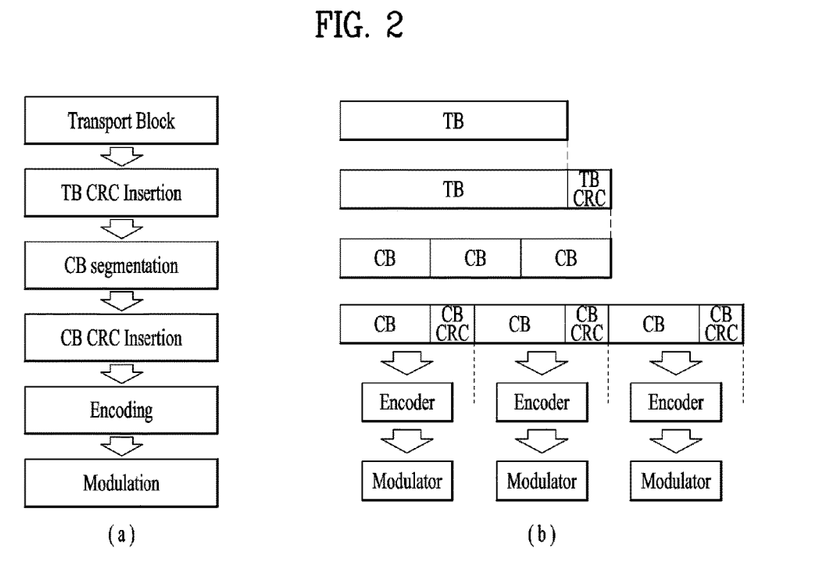
FIG. 2 illustrates a Transport Block (TB) process in a Long Term Evolution (LTE) system.

In an LTE system, channel codes including a Turbo code are mostly configured as illustrated in FIG. 2. For the convenience of description, terms as used in the LTE system will be used herein.

FIG. 2 illustrates a transport block (TB) process in the LTE system.

FIG. 2(a) illustrates an encoding process for a channel code, and FIG. 2(b) illustrates TB configuration for encoding.

Referring to FIG. 2(a), the encoding process for a channel code includes 1) TB configuration, 2) TB cyclic redundancy check (CRC) insertion, 3) code block (CB) segmentation, 4) CB CRC insertion, 5) encoding, and 6) modulation.

Referring to FIG. 2(b), the size of an input symbol may be different from the size of a TB from a medium access control (MAC) layer. If a TB is larger than a maximum input symbol size for the Turbo code, the TB is segmented into a plurality of CBs. Herein, the size of a CB is (6144-CRC) bits. An input symbol for the Turbo code is data including a CB and a CRC or a TB (<6144 bits) and a CRC. In the present invention, since the number of CRC bits is very small (24 bits at maximum) relative to 6144 bits, only a CB ($\approx$CB+CRC) and a TB ($\approx$TB+CRC) are used herein, for the convenience of description of a channel code.

Decoding of a channel code is performed in a reverse order to the process illustrated in FIG. 2. During decoding, a decoder corresponding to each encoder is used. After each CB is decoded, a final TB is configured and a TB CRC is checked.

In the LTE system, an ACKnowledgement/Negative ACKnowledgement (ACK/NACK) signal, which is a feedback indicating whether a transmission is successful or failed, is transmitted in an $(i+4)^{th}$ transmission subframe for an $i^{th}$ transmission subframe in frequency division duplex (FDD) mode. For a signal retransmission, an $(i+8)^{th}$ transmission subframe is accordingly used. This timing is set in consideration of a time taken for processing a TB and a time taken for generating an ACK/NACK signal. Most of the time is taken for processing a channel code. In time division duplex (TDD) mode, a different transmission time is used for each DL/UL configuration in consideration of the above required time and UL subframe allocation, and bundling and multiplexing are employed.

Figure 3:
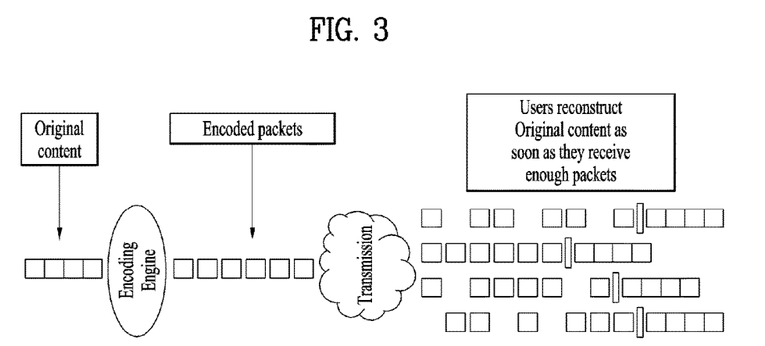
FIG. 3 illustrates an operation for completing decoding by receiving six packets by four users.

FIG. 3 illustrates an operation for completing decoding by receiving six packets by four users.

Unlike the LTE system, a digital video broadcasting (DVB) system uses a Raptor code as an error correction code at an application layer, for which the code rate is produced freely relative to the Turbo code. Such a code that is not based on a fixed code rate is called a rateless code. A big benefit offered conceptually by the rateless code is that a transmitter may transmit code symbols until a receiver perfectly decodes data. An example is illustrated in FIG. 3. Since data may be transmitted until a total of four users completely decode data, the Raptor code is approved as a standard for the DVB system.

There is a scheme in which if a receiver fails in decoding a CB CRC, the receiver generates a NACK signal and transmits the NACK signal for the index of a corresponding CB to a transmitter, thereby requesting only the corresponding part. Because after decoding at least one whole CB, the receiver is capable of determining whether it has failed in decoding the CB, this scheme does not simplify the decoding operation for the Turbo code. Techniques and structures for reducing a decoding time for the Turbo code have been proposed. However, these techniques are also based on the premise that a whole received codeword is decoded. For example, decoding is performed and a mismatch between code rates is fast fed back. This technique is based on determination as to whether a decoding result is success or failure.

If a channel environment is not predicted accurately, the rateless code makes it difficult to decode with a minimum parity overhead and requires decoding of a whole corresponding codeword at a fixed transmission code rate. That is, for application to a system, a fixed transmission code rate is used, as is the case with the Turbo code. Due to this problem, there is no accurate knowledge of a channel for each user or if ever, the channel may be changed during transmission in a broadcast environment, for example, in FIG. 3. Therefore, users may not determine an appropriate amount of data to be decoded, for successful decoding. A code rate is set for a user expected to have the poorest channel and then each user receives a whole codeword and decode the codeword, at the code rate.

The present invention provides a method for reducing use of a codeword during decoding in a situation where a given quality of service (QoS) (e.g., a target packet error rate (PER) (=a required PER), hereinafter, referred to as a target PER) is satisfied. Specifically, the present invention is intended to provide a channel coding method and a related signal transmission method, in the case where even though a transmitter (e.g., a BS) transmits data at a code rate matching a target PER based on a channel state information (CSI) feedback (or a channel quality indication (CQI)) received from a UE, the resulting code rate does not match the target PER due to a channel change, an inappropriate coding level setting, or the like.

According to the method of the present invention, a code rate may be determined in a situation where accurate UE specific adaptation is difficult (e.g., CSI outdating (fast movement), non-configuration of a CSI report mode between a transmitter and a receiver, or coarse CSI (broadcasting information, device to device (D2D), vehicle to vehicle (V2V), or the like)). For example, data may be transmitted in the most robust modulation and coding scheme (MCS) to satisfy the reception performance of a target PER to any receivers in a broadcast environment.

Also, the present invention is intended to provide a method for generating a NACK signal fast without decoding using a long codeword by preliminarily determining that a target PER is not satisfied, just with a given codeword. For the convenience of description, regarding link adaptation, the present invention deals with only a channel coding part, while fixing a modulation order.

Figure 4:
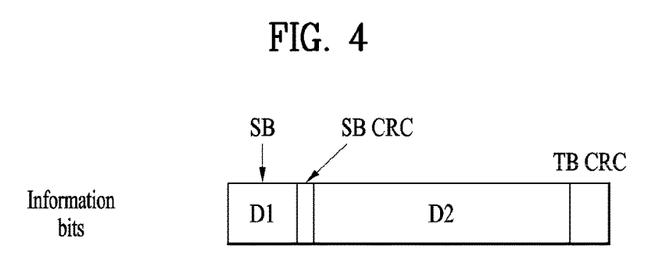
FIG. 4 is a view describing a method for inserting a new Cyclic Redundancy Check (CRC) to configure information bits before inputting a channel code according to the present invention.

FIG. 4 is a view describing a method for inserting a new CRC to configure information bits before channel code input according to the present invention.

In the legacy LTE system, a CRC is inserted in a TB. If the TB is larger than a maximum input symbol size for the Turbo code, the TB is segmented into CBs, a CRC is inserted in each CB, and channel encoding is performed on a CB basis. In contrast, the present invention proposes that information bits are input in units of a small block (SB) in a TB and a new CRC is inserted in an SB. In FIG. 4, a TB may include data D1+D2 or data D2. The size of D1 may be very small, relative to D2, and the sizes of D1 and D2 and a relative size ratio may vary according to a used channel code and a target PER.

The present invention proposes that information bits are input in units of an SB in a TB and a new CRC is inserted in an SB, before channel code input.

Figure 5:
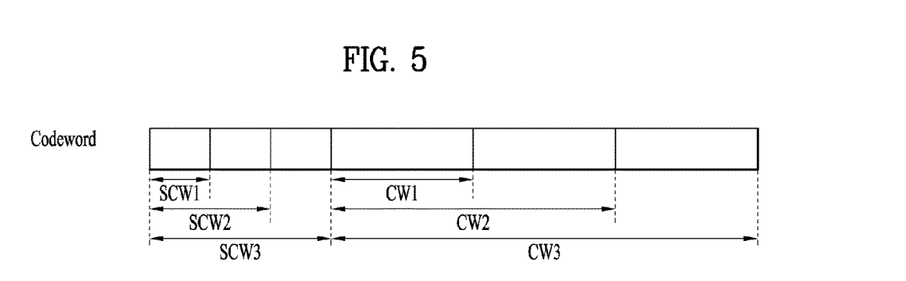
FIG. 5 illustrates a method for configuring a new codeword for information bits including a new CRC in a small block (SB)

FIG. 5 illustrates a method for configuring a new codeword for information bits including a new CRC in an SB.

SCW represents a small codeword (a partial codeword or referred to as many other terms) resulting from encoding an SB and an SB CRC, and CW represents a codeword resulting from encoding a TB and a TB CRC. That is, a CW includes an SCW. The lengths of SCW1, SCW2, and SCW3 may vary depending on the target PER of D1 and a used channel code. Based on the property that as a CW is longer, it has more parity bits and thus a PER is dropped, performance PER1 may be achieved by decoding using SCW1 and performance PER2 (<PER1) may be achieved by decoding using SCW2. Like SCWs, CW1, CW2, and CW3 may also utilize the property that as a CW is longer, a lower PER is achieved.

The present invention provides a method for determining whether to decode a long CW after decoding using a short SCW included in the CW.

Due to its short length, an SCW is decoded in a very short time. It may be determined whether data of up to SCW1, SCW2, or SCW3 is to be used, or decoding may be performed starting from SCW1 and if the decoding is failed, decoding may be performed up to SCW3. For example, it is assumed that a transmitter generates SCW1 for a target PER, PER1, SCW2 for a target PER, PER2, and SCW3 for a target PER, PER3 (PER1>PER2>PER3). If the target PER of a link is PER2, a receiver may repeat decoding using SCW1, SCW2, and SCW3 in this order until an ACK is generated from an SB CRC, or repeat decoding using SCW3, SCW2, and SCW1 in this order until a NACK is generated from an SB CRC.

It is designed that a target PER using an SCW and a target PER using a CW are placed in a one-to-one mapping relationship. In the mapping relationship, the target PERs of an SCW and a CW may be perfectly same. Meanwhile, to avoid a case in which decoding of an SB CRC is successful but decoding of a TB CRC is failed, the target PER of an SCW may be lower than the target PER of a CW. For the one-to-one mapping relationship, an SCW and a CW should be mixed by means of an interleaver prior to transmission in order to mitigate selective fading. The receiver checks an SB CRC, determines a PER that a current channel satisfies, and decodes only up to a corresponding CW length. For example, if decoding of an SB CRC in SCW1 is failed but decoding of an SB CRC in SCW2 is successful, decoding is performed using CW2 corresponding to SW2. In an example of the one-to-one mapping relationship between the target PERs of SCWs and the target PERs of CWs, a target PER in the case of using SCW1 may correspond to the target PER of CW1, and a target PER in the case of using SCW2 may correspond to the target PER of CW2.

In FIG. 4, since D1 may be very small relative to D2, an SCW may be short relative to a CW, and the parity overheads of the SCW and CW may be different according to target PERs and a used channel code. For example, an SCW includes more parity bits than a CW in order to satisfy the same target PER using the same channel code.

Like the LTE Turbo code, a BS predetermines a code rate and then transmits a codeword. For example, although up to CW3 is transmitted, up to CW2 may be decoded in view of an actual channel change or a target PER change, and decoding may be impossible even with CW3. In this case, the method of the present invention may reduce a decoding time by determining a CW to be decoded using an SCW and thus reducing a codeword length for decoding. If TB CRC decoding is obviously failed despite decoding, this is determined in advance by an SB CRC and thus CW decoding is not performed. As a consequence, a time for determining a NACK signal and power consumption involved in decoding may be reduced. Similarly, since a target PER in the case of using an SCW may be lower than the target PER of a CW, a time for determining an ACK signal before decoding may be reduced.

Figure 6:
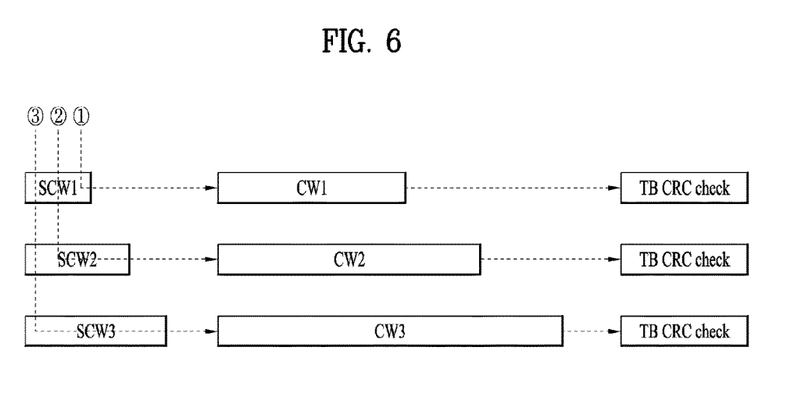
FIG. 6 is an exemplary view describing a decoding operation according to the present invention.

FIG. 6 is an exemplary view illustrating a decoding operation according to the present invention.

① If a receiver succeeds in decoding an SB CRC during decoding using SCW1, the receiver decodes using CW1. Herein, the receiver may check a TB CRC and if the TB CRC check indicates decoding success, the receiver may discontinue the decoding. If the TB CRC decoding is failed, the receiver decodes using SCW2. However, since the target PERs of SCWs are set to be lower than the target PERs of CWs in one-to-one mapping between SCWs and CWs, the case of a successful SB CRC check but a failed TB CRC check may be minimized.

② If the SB CRC decoding is failed or the TB CRC decoding is failed in step ①, the receiver decodes using SCW2. The subsequent operation is performed in the same mapper as in ①.

③ If the SB CRC decoding is failed or the TB CRC decoding is failed in step ②, the receiver decodes using SCW3, like step ②. If SB CRC decoding and TB CRC decoding are failed, the receiver may generate a NACK signal and transmit the NACK signal to a transmitter.

While it has been described in the above example that one TB is mapped to one CB, that is, CB segmentation is not performed, the present invention is applicable in the same manner, if a TB CRC is replaced with a CB CRC despite CB segmentation.

A codeword of a maximum length may be transmitted all the time in consideration of ultra reliability radio (URR). In this case, low latency radio (LLR) may also be satisfied using the above method.

Also, the present invention is applicable to vehicle to everything (V2X). Low-latency, high-reliability communication has recently attracted much attention for accident prevention and self-driving in the so-called V2X technology including in-vehicle communication, vehicle-to-vehicle (V2V) communication, vehicle-to-infrastructure (V2I) communication, and vehicle-to-nomadic device (V2N) communication. Herein, appropriate link adaptation may be impossible due to radio link impairment (e.g., an obstacle such as a building between links along with vehicle rotation).

Even though a transmitter (e.g., a BS) transmits data at a code rate matching a target PER based on a CQI feedback received from a receiver (e.g., a UE), the code rate may be regarded as not matching the target PER in view of a channel change or an inappropriate coding level setting. In this case, appropriate link adaptation may be failed.

Figure 7:
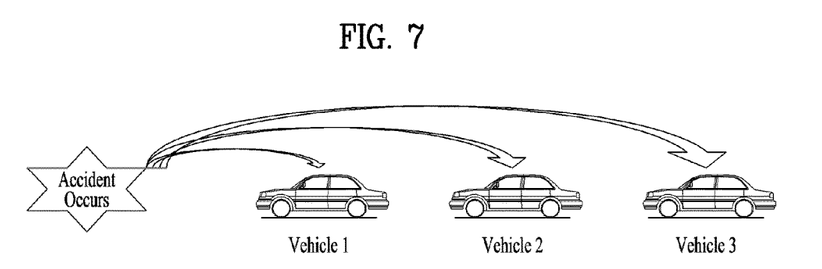
FIG. 7 illustrates a broadcast environment for transmitting accident information.

In V2X, largely two situations may be considered for application of the present invention. FIG. 7 illustrates a broadcast environment for transmitting accident information. In the broadcast environment using various channels for transmission of accident information and the like as illustrated in FIG. 7, the distance from an accident spot or an accident information transmitter to, for example, each vehicle is different and thus path loss also differs. Although information may be transmitted to each vehicle through a link for the vehicle, the information may be broadcast since the same information is transmitted to all vehicles. In the case of broadcasting the information, vehicle 1 receives more parity overhead than a target FER on the assumption that vehicle 3 receives the information. Thus, a codeword length may be reduced for vehicle 1 by implementing the present invention. Similarly, if entertainment information is broadcast to different display screens in a vehicle, various target FERs may be considered.

While the Turbo code used in the LTE system has been described above, by way of example, the present invention is not limited to the Turbo code. Rather, a low density parity check (LDPC) code of 802.11ac may be used. The LDPC code may also operate in the same manner as described for the Turbo code. The LDPC code is a block code. Even though a CRC is not used, it may be determined whether a CW or SCW has an error by a syndrome check of the LDPC code itself, like a CRC. Therefore, the use of the LDPC code obviates the need for adding an SB CRC as illustrated in FIG. 4, thereby reducing overhead compared to a convolutional code series such as the Turbo code.

Figure 8:
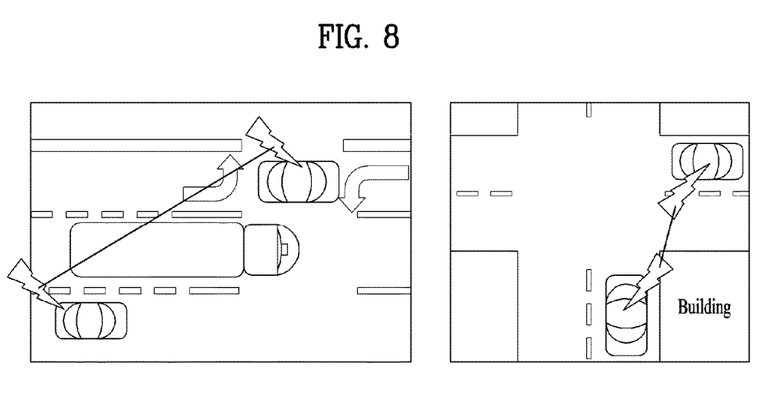
FIG. 8 illustrates a radio link impairment situation.

FIG. 8 illustrates a radio link impairment situation.

In V2X, link adaptation is not easy due to an abrupt obstacle, for example, a truck or a building between communicating vehicles as illustrated in FIG. 8, compared to LTE using a BS antenna installed in a high place. As a consequence, V2X may not provide a stable channel environment. In this context, although a transmitting vehicle causes additional parity overhead (parity exceeding an appropriate level) for a stable operation, if an actual channel is stable, a receiving vehicle may decode using an appropriate amount of parity, that is, a small codeword length.

In FIG. 8, a PER may be increased significantly due to a building. The present invention provides a method for continuing communication against an increased PER on the assumption that corresponding vehicles determine whether to continue or discontinue communication regarding the increased PER. Since a vehicle may predict generation of an obstacle as illustrated in FIG. 8 using a sensor or its predicted route, the vehicle performs signaling about obstacle generation. The signaling indicates transmission of data in the form of an SCW because an obstacle will be or is likely to be generated. A few empirical code rates may be predetermined for the signaling. A transmitter may perform the signaling with increased parity overhead using a rateless code, a redundancy version (RV) for Turbo code retransmission, or iterative transmissions of the same codeword. A receiver may perform channel decoding after checking QoS.

As is apparent from the foregoing description, since a channel code with a new CRC is encoded/decoded according to an embodiment of the present invention, an ACK/NACK signal can be generated fast.

The embodiments of the present invention described above are combinations of elements and features of the present invention in specific forms. The elements or features may be considered selective unless otherwise mentioned. Each element or feature may be practiced without being combined with other elements or features. Further, an embodiment of the present disclosure may be constructed by combining parts of the elements and/or features. Operation orders described in embodiments of the present invention may be rearranged. Some constructions or elements of any one embodiment may be included in another embodiment and may be replaced with corresponding constructions or features of another embodiment. It is obvious to those skilled in the art that claims that are not explicitly cited in each other in the appended claims may be presented in combination as an embodiment of the present disclosure or included as a new claim by a subsequent amendment after the application is filed.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A method for decoding a channel code by a communication apparatus in a wireless communication system, the method comprising:
    decoding, by a processor of the communication apparatus, a first partial codeword having a first quality of service (QoS), the first partial codeword corresponds to a result of encoding a first partial block and a cyclic redundancy check (CRC) of the first partial block, the first partial block is included in a transport block (TB);
    determining, by the processor, whether the CRC of the first partial block has been decoded successfully; and
    if the CRC of the first partial block has been decoded successfully, decoding, by the processor, a first codeword corresponding to the first partial codeword, and
    if the CRC of the first partial block has not been decoded successfully, decoding, by the processor, a second partial codeword having a second QoS, the second partial codeword corresponds to a result of encoding a second partial block and a CRC of the second partial block, the second partial block is included in the TB,
    wherein a length of the second partial codeword is longer than a length of the first partial codeword, and
    wherein a size of information bits of the second partial codeword is greater than a size of information bits of the first partial codeword.

2. The method according to claim 1, further comprising:
    if the CRC of the second partial block has been decoded successfully,
    decoding a second codeword corresponding to the second partial codeword; and
    determining whether a TB CRC has been decoded successfully.

3. The method according to claim 2, further comprising:
    if the TB CRC has been decoded successfully, generating an ACK signal.

4. The method according to claim 1, further comprising:
    if a TB CRC has been decoded successfully, generating an acknowledgement (ACK) signal.

5. The method according to claim 2, further comprising if it is determined that the TB CRC has not been decoded successfully by decoding the second partial codeword, generating a negative ACK (NACK) signal.

6. The method according to claim 1, wherein the first QoS includes a target packet error rate (PER).

7. The method according to claim 6, wherein a target PER of the first partial codeword having the first QoS is set to be equal to or lower than a target PER of the first codeword.

8. A communication apparatus for decoding a channel code in a wireless communication system, the communication apparatus comprising:
    a processor configured to:
    decode a first partial codeword having a first quality of service (QoS), the first partial codeword corresponds to a result of encoding a first partial block and a cyclic redundancy check (CRC) of the first partial block, the first partial block is included in a transport block (TB);
    determine whether the CRC of the first partial block has been decoded successfully;
    if the CRC of the first partial block has been decoded successfully, decode a first codeword corresponding to the first partial codeword, and
    if the CRC of the first partial block has not been decoded successfully, decode a second partial codeword having a second QoS, the second partial codeword corresponds to a result of encoding a second partial block and a CRC of the second partial block, the second partial block is included in the TB,
    wherein a length of the second partial codeword is longer than a length of the first partial codeword, and
    wherein a size of information bits of the second partial codeword is greater than a size of information bits of the first partial codeword.

9. The communication apparatus according to claim 8, wherein the processor is further configured to:
    if the CRC of the second partial block has been decoded successfully, decode a second codeword corresponding to the second partial codeword; and
    determine whether a TB CRC has been decoded successfully.

10. The communication apparatus according to claim 9, wherein if the processor determines that the TB CRC has not been decoded successfully by decoding the second partial codeword, the processor is configured to generate a negative ACK (NACK) signal.

11. The communication apparatus according to claim 9, wherein the first QoS includes a target packet error rate (PER).

12. The communication apparatus according to claim 11, wherein a target PER of the first partial codeword having the first QoS is set to be equal to or lower than a target PER of the first codeword.

\* \* \* \* \*